United States Patent [19]
Batra

[11] Patent Number: 5,483,402
[45] Date of Patent: Jan. 9, 1996

[54] MAGNETO RESISTIVE HEAD HAVING SYMMETRIC OFF-TRACK PERFORMANCE PROFILE

[75] Inventor: Sharat Batra, Shrewsbury, Mass.

[73] Assignee: Quantum Corporation, Milpitas, Calif.

[21] Appl. No.: 259,795

[22] Filed: Jun. 15, 1994

[51] Int. Cl.$^6$ .................................................. G11B 5/39
[52] U.S. Cl. ............................................................ 360/113
[58] Field of Search ........................ 360/113; 338/32 R; 324/252

[56] References Cited

U.S. PATENT DOCUMENTS

| | | | |
|---|---|---|---|
| 4,633,685 | 5/1987 | Tsang | 360/113 |
| 4,841,398 | 6/1989 | Mowry | 360/113 |
| 4,891,725 | 1/1990 | Mowry | 360/113 |
| 4,967,298 | 10/1990 | Mowry | 360/113 |
| 5,005,096 | 4/1991 | Krounbi et al. | 360/113 |
| 5,018,037 | 5/1991 | Krounbi et al. | 360/113 |
| 5,140,484 | 8/1992 | Maruyama | 360/113 |
| 5,155,642 | 10/1992 | Voegeli | 360/113 |
| 5,412,524 | 5/1995 | Nagata et al. | 338/32 R |

FOREIGN PATENT DOCUMENTS

| | | | |
|---|---|---|---|
| 2-187912 | 7/1990 | Japan | 360/113 |
| 4-255276 | 9/1992 | Japan | 338/32 R |
| 5-054338 | 3/1993 | Japan | 360/113 |

OTHER PUBLICATIONS

Magnetoresistive Head Technology, David Markham and Fred Jeffers, Diversified Technologies Research Lab, Eastman Kodak Co. (Proc. Symposium On Magnetic Material Processes and Devices, PV90–81, 185 (1990).

*Primary Examiner*—Stuart S. Levy
*Assistant Examiner*—Craig A. Renner
*Attorney, Agent, or Firm*—David B. Harrison

[57] ABSTRACT

A magnetoresistive (MR) head using soft adjacent layer (SAL) transverse biasing and having electrical leads with the facing surfaces lying in planes canted with respect to the easy axis of magnetization of the magnetoresistive sensor element for improving the off-track performance of the MR head by making the off-track performance profile more symmetrical, thereby minimizing the difference between the location of its physical center and its magnetic center.

15 Claims, 4 Drawing Sheets

MAGNETO RESISTIVE HEAD HAVING SYMMETRIC OFF-TRACK PERFORMANCE PROFILE

BACKGROUND OF THE INVENTION

The drive towards increased areal density and higher signal to noise ratio in magnetic recording applications has necessitated the use of magnetoresistive (MR) sensors. Magnetoresistive (MR) sensors or heads are very attractive for magnetic recording applications because they have been shown to be capable of reading data from a magnetic medium at great linear densities. A MR sensor detects magnetic field signals through the resistance changes of a read element made from magnetoresistive material as a function of the magnetic flux being sensed.

The prior art teaches that for optimal performance an MR head requires two bias fields. A transverse bias field, which orients the magnetization in the plane of the MR element at approximately 45° relative to the direction of the sense current, is provided so that the response of the MR head to magnetic flux is linear. A longitudinal bias field, which extends parallel to the surface of the magnetic media and parallel to the lengthwise direction of the MR element, is provided to suppress Barkhausen noise by maintaining single domain states in the end regions of the MR head. Many different means have been employed both to linearize the sensor output and to provide for a single domain in the sense region. A number of patents have issued in this area. Exemplary of these are U.S. Pat. Nos. 4,663,685, 4,967,298, 5,079,035 and 5,005,096, which disclose MR heads using different schemes for transverse and longitudinal biasing.

However, the drive towards improved recording densities has led to the requirement for narrower recording tracks and increased linear recording density along the tracks on magnetic storage media. The use of narrower tracks makes it very critical that a MR head be positioned accurately over the track to be read as it gets repositioned during seek from one track to another by the associated servo-system. However, prior art MR heads exhibit asymmetric off-track performance that makes it difficult to position a MR head accurately over narrow tracks during seeks, thereby severely challenging the associated servo-system.

Also, MR heads are read only heads and hence require the use of separate write elements to write data to disk. Often the write operation results in zig-zag domains being formed at the edge of a track resulting in poor performance of magnetic recording systems using MR read sensors. Therefore, it is desirable for the MR sensor to be narrower than the write head so that the MR sensor is always positioned within the outer bounds of the written track. Using a narrower MR sensor results in the associated servo mechanism being further challenged because it restricts the operating range of the servo system.

Head positioning servo-mechanisms are used to accurately locate a MR head over a track on the magnetic media to maximize head performance. The servo-system has two primary functions: (1) to determine the position of the head relative to the desired track and (2) to keep the position of the head on-track by generating a position error signal by comparing the actual head position against the desired head position. The operating range of the servo-system is defined as the range of position offset values over which the relationship between the position offset of the MR head and the position error signal is linear. The operating range for the servo system is maximized and hence system performance is maximized when the slopes of the sides of the off-track profile of the MR head are equal, i.e., when the off-track performance profile of the MR head is symmetric.

Due to anisotropic flux propagation MR heads exhibit asymmetric off-track performance. This results in the location of the physical center of a MR head to be different from the location of its magnetic center. Generally, the servo-system is setup, using servo bursts that are written on disk, to accurately locate the physical center of the MR read head on the desired track. However, it is the magnetic center of the MR head that needs to be centered on the track to maximize the signal to noise ratio during operation. Hence, measurements of the offset between the location of the physical center and the magnetic center of a MR head are essential in order to write servo bursts to accurately position the magnetic center of the head on the desired track.

However, the location of the magnetic center of a MR head is dependent on the stripe height, width and thickness of the MR element in the head. Variations in MR head manufacturing processes lead to variations in the location of the magnetic center and makes it difficult to accurately predict its location. By being able to minimize the variation in location of the physical center and the magnetic center of a MR head, process variability concerns are minimized, while the need for offset measurements between the location of the physical center and the magnetic center of a MR head are also eliminated. Making the off-track performance of an MR head more symmetrical results in minimizing the variation in location of the physical center and the magnetic center of a MR head thereby improving the operating range of the servo-system, while making it possible to achieve higher track densities on the magnetic media.

It is possible to reduce the asymmetry in the off-track performance profile of a MR head by reducing the stripe height. However, reducing the stripe height significantly degrades the signal to noise ratio of the MR head system, especially for drives requiring constant current density through MR heads during operation. Further, smaller stripe heights require tighter process tolerances and thereby further constraining the MR head manufacturing process.

Hence, there is a need to make the off-track performance of a MR head more symmetrical and to minimize the variation between the magnetic center and the physical center of a MR head.

SUMMARY OF THE INVENTION

The present invention is an apparatus for improving the off-track performance of an MR head by making the offtrack performance of a MR head symmetrical.

An object of the invention is to minimize the variation between the location of the magnetic center and the physical center of the MR head.

Another object of the invention is to maintain the high signal to noise ratio for on-track performance of an MR head while improving its off-track performance.

Yet, another object of the invention is to minimize the concerns resulting from process limitations that lead to differences in the location of the magnetic center of MR heads in volume manufacturing.

Yet, another object of the invention is the reduction of engineering design time and scrap costs while adding functionality to an existing MR head manufacturing process by enabling it to produce MR heads having symmetric off-track performance.

These and other objects are attained, in a broad sense, through the use of a MR head according to the present invention. The MR head includes a soft magnetic layer and a nonmagnetic decoupling layer. The nonmagnetic decoupling layer is in contact with the soft magnetic layer. The MR head also includes a magnetoresistive layer which is in contact with the nonmagnetic decoupling layer. The magnetoresistive layer has spaced apart end regions thereon and a true easy axis of magnetization. The MR head further comprises an element operatively associated with the magnetoresistive layer to produce longitudinal bias in the end regions of the magnetoresistive layer. The MR head also includes conductive leads in spaced apart relationship with each other; the leads having spaced facing surfaces extending parallel to each other and defining an active region therebetween. The soft magnetic layer produces a transverse bias in the active region sufficient to maintain the active region in linear response mode during operation of said magnetoresistive device. The facing surfaces of the conductive leads are canted to define a predetermined acute angle with respect to the true easy axis of the magnetoresistive layer effective to ensure symmetrical off-track performance during operation of the magnetoresistive device.

The aforementioned objects are also attained, in a narrower sense, through the use of a MR head where the predetermined acute angle is 68°.

It is an advantage of this invention that the difference between the location of the physical center and the magnetic center of the MR head is minimized.

It is another advantage of this invention that the operating range of the MR head servo-system is increased.

It is yet another advantage of this invention that it possible to achieve higher track densities on the magnetic media.

The foregoing and additional objects, features and advantages of the present invention will become apparent to those skilled in the art from a more detailed consideration of the preferred embodiment thereof, taken in conjunction with the accompanying drawings.

DETAILED DESCRIPTION OF THE INVENTION

Figure 1:
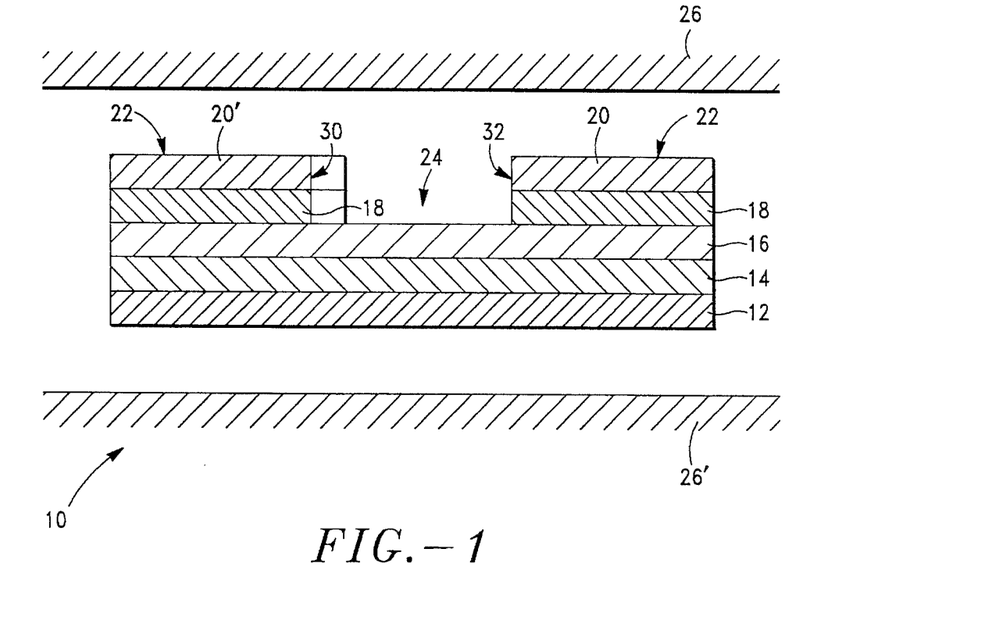
FIG. 1 is a cross-sectional view of a specific embodiment of a MR read transducer according to the principles of the invention.

With reference to FIG. 1., the magnetoresistive (MR) sensor 10 comprises of a soft adjacent layer (SAL) 12, a nonmagnetic decoupling layer 14, a magnetoresistive (MR) layer 16, an antiferromagnetic (AFM) layer 18, conductive leads 20, 20' and magnetic shields 26, 26'.

Figure 2:
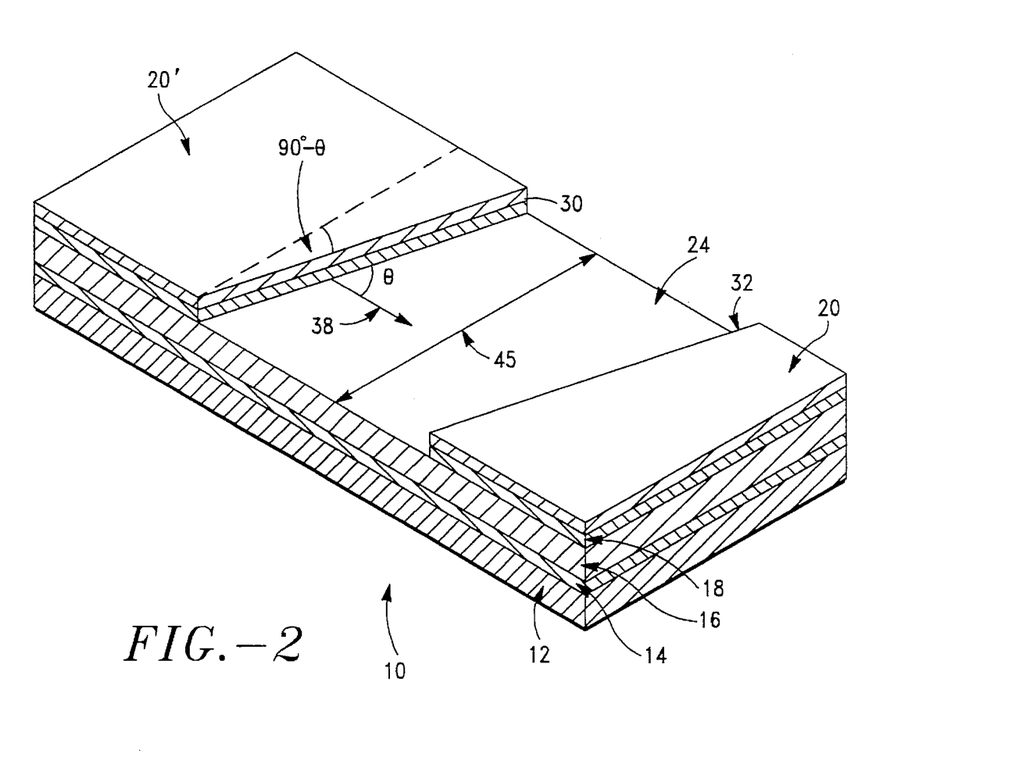
FIG. 2 is a isometric view of the MR read transducer of FIG. 1.

As shown in FIGS. 1 and 2, the MR sensor 10 is provided with longitudinal and transverse bias. The longitudinal bias for domain suppression is applied only to the end regions 22 of the MR sensor 10. The longitudinal bias is produced by an exchange biasing method. As shown in FIGS. 1 and 2, the MR sensor 10 has a MR layer 16 which is in electrical contact with an antiferromagnetic (AFM) layer 18. The AFM layer 18 is patterned to cover the end regions 22 of the MR sensor 10. Therefore, only the end regions 22 of the MR sensor 10 are exchange biased so that the MR layer 16 is longitudinally biased in a single domain mode in the end regions 22.

Further, as shown in FIGS. 1 and 2, the MR layer 16, on the side opposite from the AFM layer 18, is in electrical contact with a nonmagnetic decoupling layer 14. The decoupling layer 14 is in electrical contact with a soft adjacent layer (SAL) 12. The SAL 12 is a soft magnetic film which provides a soft film transverse bias of the central region 24 of the MR layer 16. The nonmagnetic decoupling layer 14 provides the physical separation necessary for the MR layer 16 and the SAL 12 to produce opposite magnetization rotations. The SAL 12 and the nonmagnetic decoupling layer 14 combine to produce a transverse bias field in a central region of the MR layer 16.

Further, as shown in FIG. 1, magnetic shields 26 and 26' are provided to minimize the effects of stray magnetic flux while providing higher signal amplitude at high linear recording densities.

While there are many possible choices of materials to achieve the desired response from the MR sensor of FIG. 1, good results have been obtained by using NiFe (permalloy) for the MR layer 16, NiFeRh or NiFeMo for the SAL 12, Ta for the nonmagnetic spacer layer 14, and Au or W (Tungsten) for the conductive leads 20 and 20'. As shown in FIG. 1, the MR layer 16 is approximately 200–300 A° thick, the SAL 12 is approximately 180–260 A° thick, the nonmagnetic spacer layer 14 is approximately 75–125 A° thick, and the conductive leads 20 and 20' are each approximately 2000 A° thick. Good results were obtained by using the materials and dimensions stated above. It will be apparent to those skilled in the art that various modifications can be made in the selection of materials and layer dimensions of the present invention to achieve the desired response from the MR sensor of FIG. 1.

Figure 3:
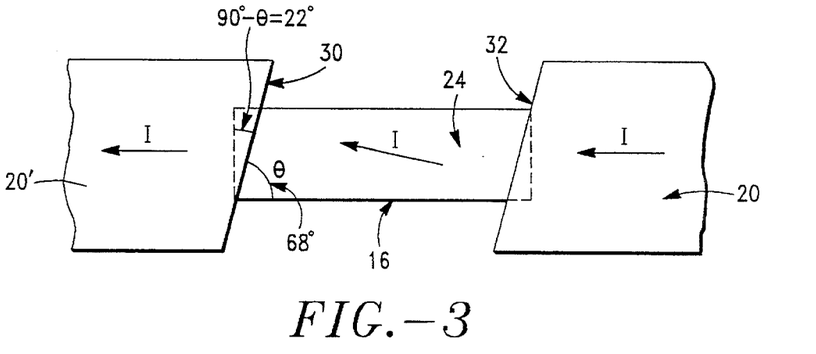
FIG. 3 is a top view of the MR read transducer of FIG. 1.

As shown in FIGS. 1 and 2, the conductive leads 20 and 20' are in electrical contact with the AFM layer 18. The conductive leads 20 and 20' have facing surfaces 32 and 30 respectively as shown in FIGS. 1 and 2. The facing surfaces 32 and 30 of the conductive leads 20 and 20' are parallel to each other and define an active region 24 therebetween. Thus, as shown in FIG. 3, current I flows from lead 20 through the active region 24 of MR layer 16 to lead 20'. The active region 24 is generally aligned with the central region of the MR layer 16, as shown in FIGS. 1 and 2. The transverse bias field provided by the SAL 12 maintains the active region 24 in a linear response mode.

Further, as shown in FIGS. 2 and 3, the facing surfaces 32 and 34 of the conductive leads 20 and 20' are canted to define an angle θ with respect to a plane extending through the true easy axis 38 of the MR layer 16. As shown in FIGS. 2 and 3, good results have been obtained by canting the leads 20 and 20' at an angle of 68°, that is, θ is 68°. The leads 20 and 20' can be canted at an any angle θ within the range of 80°–65° to obtain good results also, according to the principles of the invention. The height of the MR element 16 also called the stripe height 45 is 2.8 microns, as shown in FIG. 2. Good results have also been obtained by using stripe heights of 2.5–3.0 microns.

Magnetic flux in a conventional MR head enters the active region only when magnetic charge on the magnetic media is underneath the active region. However, by canting the conductive leads 20 and 20′, according to the principles of the invention, the active region 24 picks up a magnetic charge even when the charge is still away from the active area, that is, even when the charge is not underneath the active region 24. The ability of an MR head 10 with leads 20 and 20′ canted at an angle, according to the principles of the invention, makes its off-track performance more symmetrical.

Figure 4:
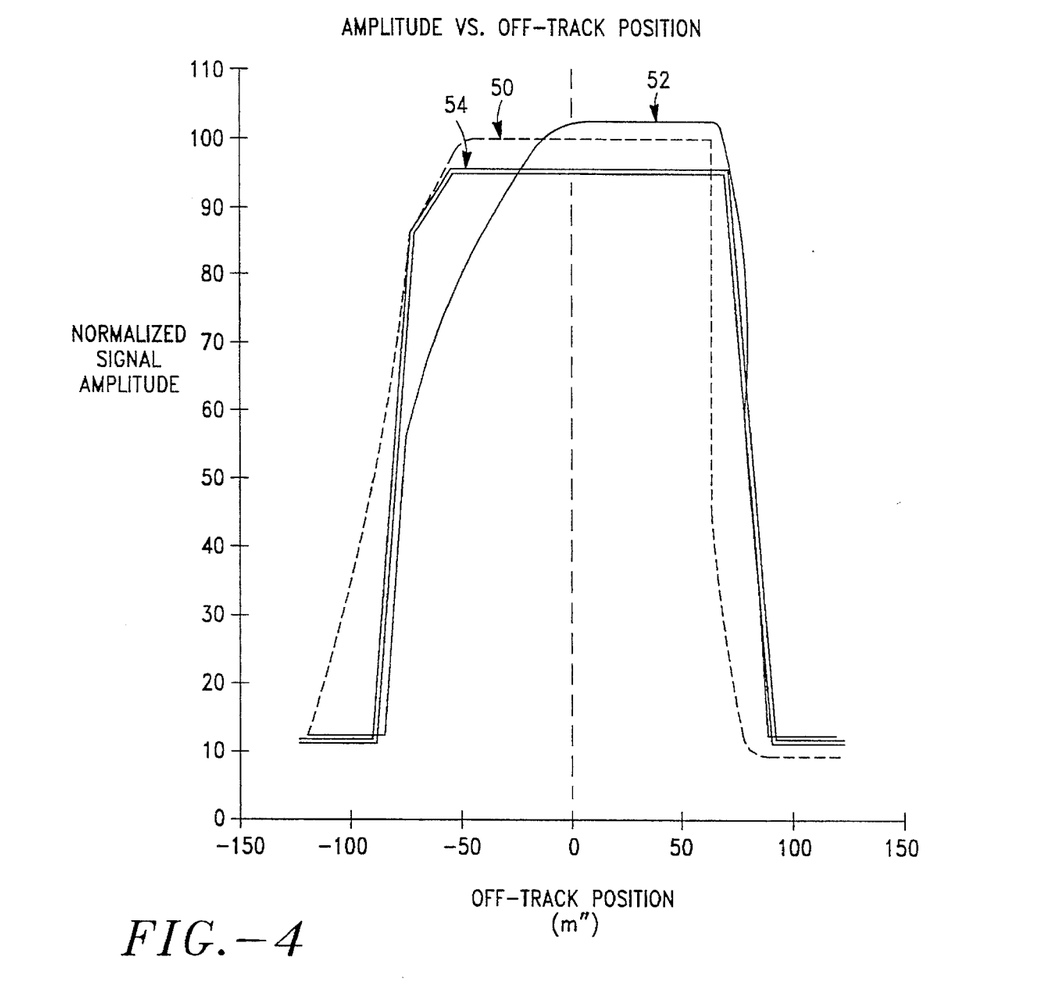
FIG. 4 is a graphical representation of the off-track performance of the MR read transducer of FIG. 1.

As shown in FIG. 4, canting the leads 20 and 20′ at an angle of 68°, according to the principles of the invention, results in a more symmetrical off-track performance profile as depicted by off-track performance curve 50. The MR stripe height 45 for the MR head 10 exhibiting off-track performance curve 50 is 2.8 microns. Also shown in FIG. 4., is the off-track performance curve 54 of a MR head having stripe height 45 of 1.4 microns. Even though curve 54 shows greater symmetry relative to curve 50, stripe height of 2.8 microns is the preferred strip height because reducing the stripe height to 1.4 microns significantly degrades the signal to noise ratio of the magnetic recording system. The asymmetric off-track performance of a conventional MR sensor is represented by curve 52 in FIG. 4.

Figure 5:
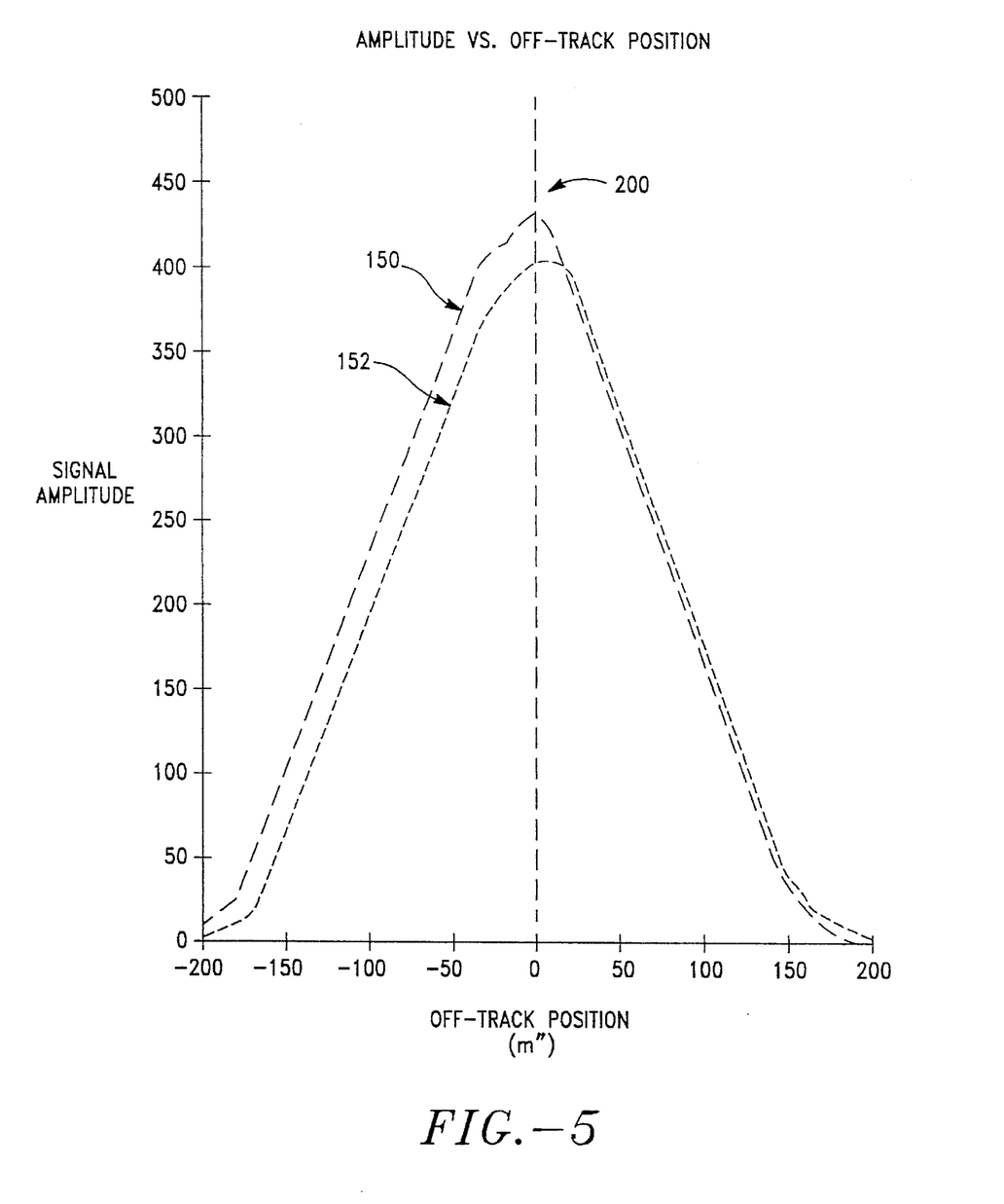
FIG. 5 is another graphical representation of the off-track performance of the MR read transducer of FIG. 1.

Further, shown in FIG. 5 is another graphical representation of the off-track performance of the MR read transducer of FIG. 1 according to the principles of the invention. As shown in FIG. 5, canting the leads 20 and 20′ at an angle of 68°, according to the principles of the invention, results in a more symmetrical off-track performance profile as depicted by off-track performance curve 150. The asymmetric off-track performance of a conventional MR sensor is represented by curve 152 in FIG. 4. A measure of the symmetry of a performance curve is obtained by computing the slope asymmetry for the curve. The following equation is used to determine slope asymmetry:

$$\text{SlopeAssymetry} = \frac{\text{Slope}_1 - \text{Slope}_2}{0.5(\text{Slope}_1 + \text{Slope}_2)}$$

where, $\text{slope}_1$ is the slope of a performance curve to the left of line 200 on FIG. 5, while $\text{slope}_2$ is the slope of a performance curve to the right of line 200 on FIG. 5.

Lower the slope asymmetry, higher is the symmetry of the performance curve. As shown in FIG. 5, the slope asymmetry, calculated using the aforementioned equation, is 1.6% for off-track performance curve 150 for an MR head 10 with leads 20 and 20′ canted at an angle of 68°. In contrast, the slope asymmetry is 3.1% for off-track performance curve 152 for a conventional MR head having un-canted leads. Therefore, it is quite clear that canting the leads 20 and 20′ at an angle of 68°, results in more symmetrical off-track performance.

Figure 6:
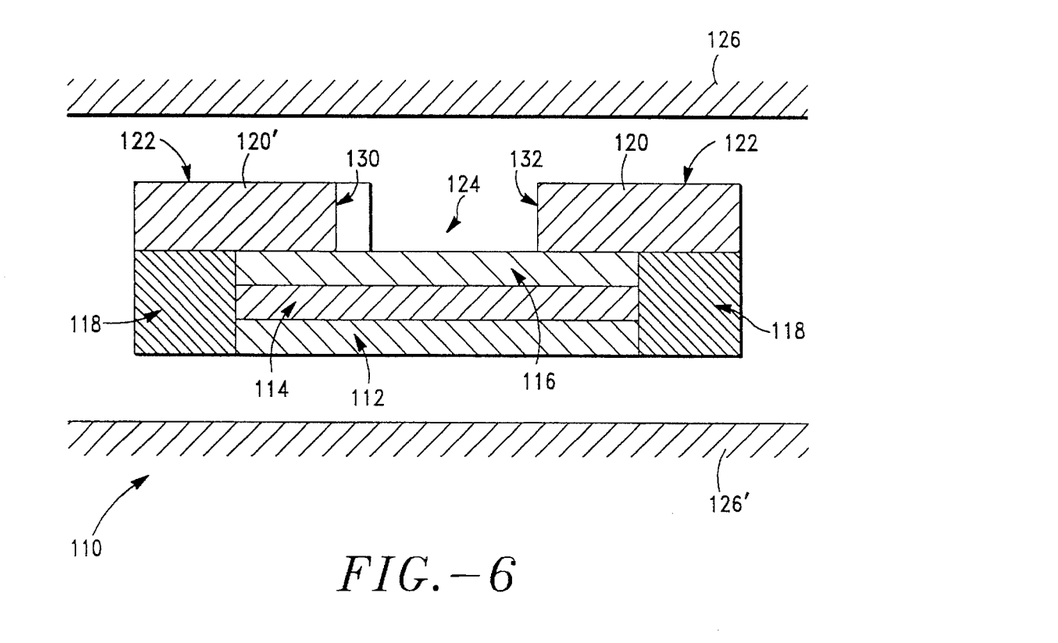
FIG. 6 is a cross-sectional view of another embodiment of a MR read transducer according to the principles of the invention.
Figure 7:
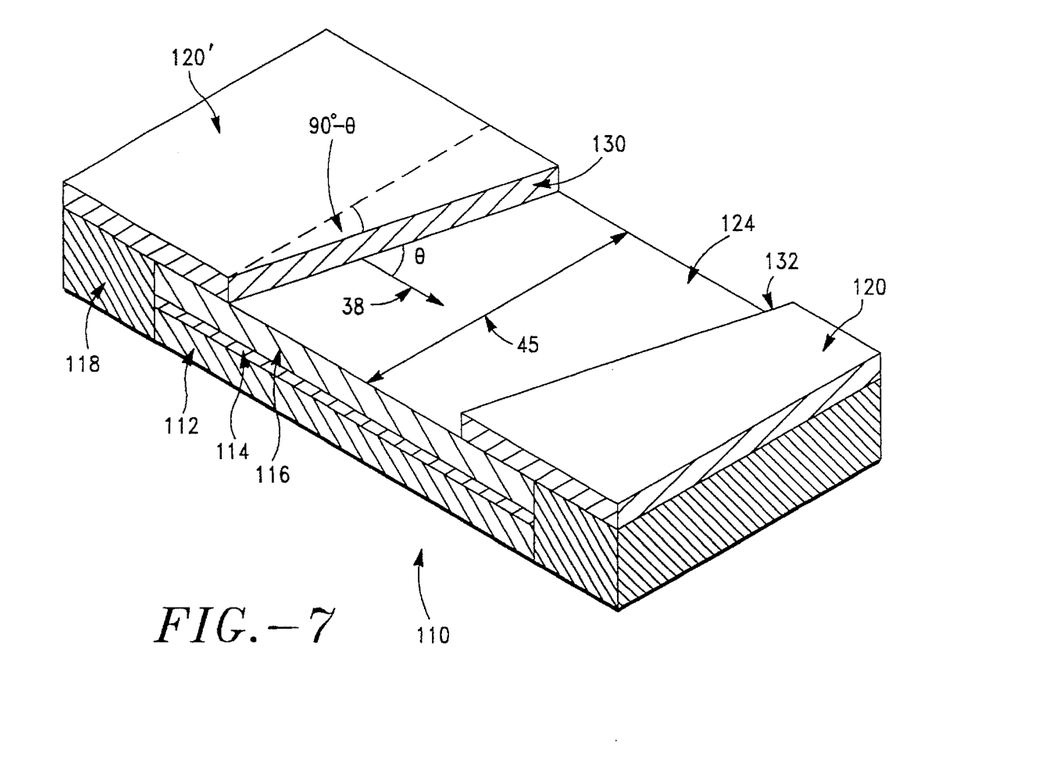
FIG. 7 is a isometric view of the MR read transducer of FIG. 6.

Referring additionally now to FIGS. 6 and 7, another embodiment of a magnetoresistive device 110 in accordance with the present invention is shown. The embodiment of FIGS. 6 and 7 is different in structure from that of FIGS. 1 and 2 in that it uses a permanent magnet for longitudinal biasing as opposed to using an antiferromagnetic layer.

As shown in FIGS. 6 and 7, magnetoresistive (MR) sensor 110 comprises of a soft adjacent layer (SAL) 112, a nonmagnetic decoupling layer 114, a magnetoresistive (MR) layer 116, permanent magnets 118, conductive leads 120, 120′ and magnetic shields 126, 126′.

As shown in FIGS. 6 and 7, the MR sensor 110 is provided with longitudinal and transverse bias. The longitudinal bias for domain suppression is applied only to the end regions 122 of the MR sensor 110. The longitudinal bias is produced by permanent magnets 118. As shown in FIGS. 6 and 7, the MR sensor 110 has a trilayer structure comprising MR layer 116, soft adjacent layer (SAL) 112, and nonmagnetic decoupling layer 114. As shown in FIGS. 6 and 7, permanent magnets 118 are located at opposite sides of the trilayer structure so that the MR layer 116 is longitudinally biased in a single domain mode in the end regions 122.

Further, as shown in FIGS. 6 and 7, the MR layer 116, is in electrical contact with a nonmagnetic decoupling layer 114. The decoupling layer 114 is in electrical contact with a soft adjacent layer (SAL) 112.

Further, as shown in FIG. 6, magnetic shields 126 and 126′ are provided to minimize the effects of stray magnetic flux while providing higher signal amplitude at high linear recording densities.

Also, as shown in FIGS. 6 and 7, the conductive leads 120 and 120′ are in electrical contact with the MR layer 116 and permanent magnets 118. The conductive leads 120 and 120′ have facing surfaces 132 and 130 respectively as shown in FIGS. 6 and 7. The facing surfaces 132 and 130 of the conductive leads 120 and 120′ are parallel to each other and intersect MR layer 116 along a pair of spaced apart facing edges that define an active region 124 therebetween. The transverse bias field provided by the SAL 112 maintains the active region 124 in a linear response mode.

Further, as shown in FIG. 7, the facing surfaces 132 and 130 of the conductive leads 120 and 120′ are canted such that a plane passing through either of facing surfaces 132 or 130 defines an angle θ a plane extending through to a plane extending through the true easy axis 38 of the MR layer 116. As shown in FIG. 7, good results have been obtained by canting the leads 120 and 120′ at an angle of 68°, that is, θ is 68°. The leads 120 and 120′ can be canted at any angle θ within the range of 80°–65° to obtain good results also.

The embodiment of FIGS. 6 and 7, having leads 120 and 120′ canted at an angle of 68°, according to the principles of the invention, results in a more symmetrical off-track performance profile as depicted by off-track performance curve 50 of FIG. 4.

While the invention has been particularly shown and described with reference to two embodiments thereof, it will be understood by those skilled in the art that various other changes in the form and details may be made therein without departing from the spirit and scope of the invention.

I claim:

1. A magnetoresistive device for reading position information within each of plural adjacent data tracks of a magnetic recording medium, the magnetoresistive device comprising:

a soft magnetic layer;

a nonmagnetic decoupling layer in contact with said soft magnetic layer;

a magnetoresistive layer in contact with said nonmagnetic decoupling layer; said magnetoresistive layer having a longitudinal axis and having spaced apart end regions thereon and having an easy axis of magnetization substantially parallel to said longitudinal axis;

an element operatively associated with said magnetoresistive layer to produce longitudinal bias in said end regions of said magnetoresistive layer; and conductive leads in a spaced apart relationship with each other; said leads having spaced facing surfaces extending generally parallel to each other and defining an active region therebetween; said soft magnetic layer producing a transverse bias in said active region sufficient to maintain said active region in linear response mode during operation of said magnetoresistive device; said facing surfaces being canted such that a plane passing coplanarly through one of said facing surfaces defines a predetermined acute angle with respect to the easy axis of said magnetoresistive layer effective to ensure symmetrical off-track response to the position information during operation of said device.

2. The magnetoresistive device of claim 1 wherein said predetermined acute angle is within a range of 80° to 65°.

3. The magnetoresistive device of claim 1 wherein said predetermined acute angle is 68°.

4. The magnetoresistive device of claim 1 wherein the element comprises an antiferromagnetic layer in contact with said magnetoresistive layer.

5. The magnetoresistive device of claim 1 wherein the element comprises permanent magnets at opposite sides of said magnetoresistive layer, said nonmagnetic decoupling layer and said soft magnetic layer.

6. The magnetoresistive device of claim 1 further comprising magnetic shields; one of said shields being located in an immediately spaced apart relationship to said conductive leads and being generally parallel to said conductive leads; another of said shields being located in an immediately spaced apart relationship to said soft magnetic layer and being generally parallel to said soft magnetic layer.

7. A magnetoresistive device for reading position information within each of plural adjacent data tracks of a magnetic recording medium, the magnetoresistive device comprising:

a soft magnetic layer;

a nonmagnetic decoupling layer in contact with said soft magnetic layer;

a magnetoresistive layer in contact with said nonmagnetic decoupling layer; said magnetoresistive layer having a longitudinal axis and having spaced apart end regions thereon and having an easy axis of magnetization substantially parallel to said longitudinal axis;

an antiferromagnetic layer in contact with said magnetoresistive layer and operatively associated with said magnetoresistive layer to produce longitudinal bias in said end regions of said magnetoresistive layer; and conductive leads in a spaced apart relationship with each other; said leads having spaced facing surfaces extending generally parallel to each other and defining an active region therebetween; said soft magnetic layer producing a transverse bias in said active region sufficient to maintain said active region in linear response mode during operation of said magnetoresistive device; said facing surfaces being canted such that a plane passing coplanarly through one of said facing surfaces defines a predetermined acute angle with respect to the easy axis of said magnetoresistive layer effective to ensure symmetrical off-track response to the position information during operation of said device.

8. The magnetoresistive device of claim 7 wherein said predetermined acute angle is within a range of 80° to 65°.

9. The magnetoresistive device of claim 7 wherein said predetermined acute angle is 68°.

10. A magnetoresistive device for reading position information within each of plural adjacent data tracks of a magnetic recording medium, the magnetoresistive device comprising:

a soft magnetic layer;

a nonmagnetic decoupling layer in contact with said soft magnetic layer;

a magnetoresistive layer in contact with said nonmagnetic decoupling layer; said magnetoresistive layer having a longitudinal axis and having spaced apart end regions thereon and having an easy axis of magnetization substantially parallel to said longitudinal axis;

permanent magnets at opposite sides of a trilayer structure, said trilayer structure being defined by said magnetoresistive layer, said nonmagnetic decoupling layer and said soft magnetic layer; said permanent magnets operatively associated with said magnetoresistive layer to produce longitudinal bias in said end regions of said magnetoresistive layer; and conductive leads in spaced apart relationship with each other; said leads having spaced facing surfaces extending generally parallel to each other and defining an active region therebetween; said soft magnetic layer producing a transverse bias in said active region sufficient to maintain said active region in linear response mode during operation of said magnetoresistive device; said facing surfaces being canted such that a plane passing coplanarly through one of said facing surfaces defines a predetermined acute angle with respect to the easy axis of said magnetoresistive layer effective to ensure symmetrical off-track response to the position information during operation of said device.

11. The magnetoresistive device of claim 10 wherein said predetermined acute angle is within a range of 80° to 65°.

12. The magnetoresistive device of claim 10 wherein said predetermined acute angle is 68°.

13. A magnetoresistive device for reading position information within each of plural adjacent data tracks of a magnetic recording medium, the magnetoresistive device comprising:

a magnetoresistive layer having a longitudinal axis and having spaced apart end regions thereon and having an easy axis of magnetization substantially parallel to said longitudinal axis;

conductive leads in spaced apart relationship with each other and electrically connected to said magnetoresistive layer, said leads having spaced facing surfaces which extend generally parallel to each other and define an active region therebetween, said facing surfaces being canted such that a plane passing coplanarly through one of said facing surfaces defines a predetermined acute angle with respect to said longitudinal axis to ensure symmetrical off-track response to the position information during operation of said device;

an element operatively associated with said magnetoresistive layer to produce longitudinal bias in at least a portion of said magnetoresistive layer;

a soft magnetic layer spaced apart from said magnetoresistive layer for producing transverse bias in at least a portion of said active region; and a nonmagnetic layer interposed between said magnetoresistive layer and said soft magnetic layer for magnetically decoupling said magnetoresistive layer from said soft magnetic layer.

14. A magnetoresistive read transducer for reading position information within each of plural adjacent data tracks of a magnetic recording medium, said transducer comprising:

a magnetoresistive layer having a longitudinal axis and having spaced apart end regions thereon and having an easy axis of magnetization substantially parallel to said longitudinal axis;

conductive leads in spaced apart relationship with each other and electrically connected to said magnetoresistive layer for providing a sense current through said magnetoresistive layer, said leads having spaced apart facing surfaces which extend generally parallel to each other and define an active region therebetween, each of said facing surfaces being canted such that a plane passing coplanarly through one of said facing surfaces defines an acute angle with respect to said longitudinal axis to ensure symmetrical off-track response to the position information during operation of said transducer;

longitudinal biasing means operatively associated with said magnetoresistive layer for maintaining a single domain state in said end regions; and soft adjacent layer means for providing transverse bias in at least a portion of said active region.

15. A magnetoresistive read transducer for reading position information within each of plural adjacent data tracks of a magnetic recording medium, said transducer comprising:

a magnetoresistive layer having a longitudinal axis and having spaced apart end regions thereon and having an easy axis of magnetization substantially parallel to said longitudinal axis;

conductive leads in spaced apart relationship with each other and electrically connected to said magnetoresistive layer for providing a sense current through said magnetoresistive layer, said leads having spaced apart facing edges which extend generally parallel to each other and define an active region therebetween, each of said facing edges being canted such that a line passing coplanarly through one of said facing edges defines an acute angle with respect to said longitudinal axis to ensure symmetrical off-track response to the position information during operation of said transducer;

longitudinal biasing means operatively associated with said magnetoresistive layer for maintaining a single domain state in said end regions; and soft adjacent layer means for providing transverse bias in at least a portion of said active region.

* * * * *

UNITED STATES PATENT AND TRADEMARK OFFICE
CERTIFICATE OF CORRECTION

PATENT NO. : 5,483,402
DATED : January 9, 1996
INVENTOR(S) : Sharat Batra

It is certified that error appears in the above-indentified patent and that said Letters Patent is hereby corrected as shown below:

Column 10, claim 15, line 11, "coplanarly" should read --colinearly--.

Signed and Sealed this

Thirtieth Day of April, 1996

Attest:

BRUCE LEHMAN

Attesting Officer      Commissioner of Patents and Trademarks